United States Patent [19]
St. Lawrence et al.

[11] Patent Number: 5,972,811
[45] Date of Patent: *Oct. 26, 1999

[54] POLYBUTADIENE AND POLYISOPRENE THERMOSETTING COMPOSITIONS AND METHOD OF MANUFACTURE THEREOF

[75] Inventors: Michael E. St. Lawrence, Thompson; Doris I. Hand, Dayville; Vincent R. Landi, Danielson, all of Conn.; Robert H. Walker, Phoenix, Ariz.; Samuel Gazit, Bet Lechem HaGlilit, Israel; Raymond R. Miskiavitch, Putnam, Conn.

[73] Assignee: World Properties, Inc., Lincolnwood, Ill.

[*] Notice: This patent is subject to a terminal disclaimer.

[21] Appl. No.: 09/090,789

[22] Filed: Jun. 4, 1998

Related U.S. Application Data

[63] Continuation of application No. 08/690,929, Aug. 1, 1996, Pat. No. 5,858,887, which is a continuation-in-part of application No. 08/322,890, Oct. 13, 1994, Pat. No. 5,571,609.

[51] Int. Cl.[6] ....................................... B32B 7/00
[52] U.S. Cl. .................. 442/237; 442/173; 442/180; 442/233; 442/234; 524/571
[58] Field of Search ..................................... 442/173, 180, 442/233, 234, 237; 524/571

[56] References Cited

U.S. PATENT DOCUMENTS

| | | |
|---|---|---|
| 3,642,687 | 2/1972 | Naarmann et al. . |
| 3,644,584 | 2/1972 | Fryd . |
| 3,860,672 | 1/1975 | Lagally . |

(List continued on next page.)

FOREIGN PATENT DOCUMENTS

| | | |
|---|---|---|
| 0 202 488 | 11/1986 | European Pat. Off. . |
| 0 220 160 | 4/1987 | European Pat. Off. . |
| 0 234 450 | 9/1987 | European Pat. Off. . |
| 0 389 076 | 9/1990 | European Pat. Off. . |

(List continued on next page.)

OTHER PUBLICATIONS

"High Vinyl 1–2 Liquid Polybutadiene–Ricon Molding Compounds CCS–110" Feb. 1, 1980 Colorado Chemical Spec.

Colorado Chemical Brochure—"Ricon Product Bulletin", Aug. 20, 1985 High Vinyl 1–2 Liquid Polybutadiene.

Colorado Chemical Brochure—"Ricon Radome" High Vinyl 1–02 Liquid Polybutadiene.

N. Sawatari, I. Watanabe, H. Okuyama and K. Murakawa, "A New Flame Retardant, 1,2–Polybutadiene Laminate", 1983 pp. 131–137.

C.F. Chen, "Dielectric Properties Of Polybutadiene And its Reinforced Composites At Room And Elevated Temperature" pp. 318–320.

(List continued on next page.)

*Primary Examiner*—Helen L. Pezzuto
*Attorney, Agent, or Firm*—Cantor Colburn LLP

[57] ABSTRACT

An electrical substrate material is presented comprising a thermosetting matrix of polybutadiene or polyisoprene and a co-curable second resin distinct from the first resin. A peroxide cure initiator and/or crosslinking agent may optionally be added. The presence of a very high surface area particulate filler, preferably fumed silica, is also preferred, in that its presence results in a prepreg which has very little tackiness and can therefore be easily handled by operators. This low tackiness feature allows for the use of conventional automated layup processing, including foil cladding, using one or more known roll laminators. While the prepreg of this invention is tack-free enough to be handled relatively easily by hand, it is also tacky enough to be tacked to itself using a roll laminator (e.g., nip roller) at room temperature. The composition of this invention is particularly well suited for making electrical circuit substrates for microwave and digital circuits, typically in the form of the thermosetting composition being laminated onto one or both opposed surfaces to a metal conductive foil such as copper.

42 Claims, 3 Drawing Sheets

U.S. PATENT DOCUMENTS

| | | |
|---|---|---|
| 3,919,133 | 11/1975 | Dawans et al. . |
| 3,940,534 | 2/1976 | Fick et al. . |
| 4,017,436 | 4/1977 | Tabana et al. . |
| 4,197,377 | 4/1980 | Bohm et al. . |
| 4,229,550 | 10/1980 | Jones et al. . |
| 4,241,132 | 12/1980 | Pratt et al. . |
| 4,268,433 | 5/1981 | Sawatari et al. . |
| 4,370,448 | 1/1983 | Leland . |
| 4,384,066 | 5/1983 | O'Shea . |
| 4,499,240 | 2/1985 | Valentine . |
| 4,554,470 | 11/1985 | Jerson et al. . |
| 4,587,300 | 5/1986 | Valentine . |
| 4,600,745 | 7/1986 | Creighton . |
| 4,704,318 | 11/1987 | Saito et al. . |
| 4,789,708 | 12/1988 | Guzy . |
| 4,820,764 | 4/1989 | Guzy et al. . |
| 4,997,702 | 3/1991 | Gazit et al. . |
| 5,223,568 | 6/1993 | Landi et al. ............................ 524/571 |
| 5,264,065 | 11/1993 | Kohm . |
| 5,571,609 | 11/1996 | St. Lawrence et al. ................ 428/268 |

FOREIGN PATENT DOCUMENTS

| | | |
|---|---|---|
| 0 430 092 A3 | 6/1991 | European Pat. Off. . |
| 0 460 539 A2 | 12/1991 | European Pat. Off. . |
| 0707038A1 | 9/1995 | European Pat. Off. . |
| 253412 | 9/1975 | Germany . |
| 26 48 595 | 5/1977 | Germany . |
| 4-258658 | 9/1992 | Japan . |
| 050162238 | 6/1993 | Japan . |
| 050309651 | 11/1993 | Japan . |
| 1195567 | 6/1970 | United Kingdom . |
| 2 172 892 | 10/1986 | United Kingdom . |

OTHER PUBLICATIONS

Ronald E. Drake, "1,2–Polybutadienes–High Performance Resins For The Electrical Industry", pp. 730–733.

Bruzzone et al., LaChimica E. L'Industria 47 (12) 1298–1302 (1965) "High–Temperature Thermal Cross–Linking of Cistatic Polybutadiene".

Nippon Soda Brochure– "Nisso–PB".

McCreedy et al., Polymer 20(4)(1979) "Effect of Thermal Crosslinking on Decomposition of Polybutadiene".

Takeuchi et al., "A New Thermoplastic Syndiotatic 1,2–polybutadiene," in New Industrial Polymers, ACS #4, pp. 15–25.

Colorado Chemical Brochure– "Ricon Electrical/Electronic".

Colorado Chemical Brochure– "Ricon Laminating Resins".

Barth et al., Modern Plastics pp. 142–148, *(Nov. 1970) "Fast–Curing Polybutadiene Thermosetting Resins".

POLYBUTADIENE AND POLYISOPRENE THERMOSETTING COMPOSITIONS AND METHOD OF MANUFACTURE THEREOF

CROSS-REFERENCE TO RELATED APPLICATION

This application is a continuation of application Ser. No. 08/690,929, filed on Aug. 1, 1996, now U.S. Pat. No. 5,858,887, which is a continuation-in-part of application Ser. No. 08/322,890, filed on Oct. 13, 1994, now U.S. Pat. No. 5,571,609.

BACKGROUND OF THE INVENTION

This invention relates generally to a method of making thermosetting composites and the resulting product which preferably comprises electrical circuit laminate materials. More particularly, this invention relates to an electrical circuit laminate comprising (1) a thermosetting resin of polybutadiene or polyisoprene; (2) a woven fibrous web impregnated with the resin; and (3) inorganic particulate filler such as silica, titania and the like. In accordance with an important feature of this invention, the filler loadings for both the woven web (fabric) and particulate filler are selected such that individual layers are relatively tack free thereby allowing ease of handling for lamination without the need for B-staging. The material of this invention allows for relatively low lamination temperatures.

Commonly assigned U.S. Pat. No. 5,223,568 (which is fully incorporated herein by reference) describes a thermosetting composition which is particularly useful for making electrical substrate materials. In general, U.S. Pat. No. 5,223,568 describes a composition formed from the steps of:

(a) providing a moldable thermosetting composition that includes (1) polybutadiene or polyisoprene resin which is a liquid at room temperature and which has a molecular weight less than 5,000 and (2) a solid butadiene or isoprene-containing polymer capable of crosslinking with the polybutadiene or polyisoprene resin;

(b) forming the composition into a shape; and (c) curing the composition to produce the electrical substrate material including subjecting the composition to a high temperature cure condition at a temperature greater than about 250° C. and less than the decomposition temperature of the composition. This composition thus comprises a two component system, the first component being the polybutadiene or polyisoprene resin and the second component being the solid butadiene or isoprene-containing polymer, all of which are subjected to the high temperature curing cycle (e.g., greater than 250° C.).

In preferred embodiments, the solid polymer is a thermoplastic elastomer block copolymer.

U.S. Pat. No. 5,223,568 also describes a composition with a dielectric filler (i.e., a material having a dielectric constant greater than about 1.2 at microwave frequencies) homogeneously dispersed throughout the composition to the extent that when the composition is cured the properties of the cured article, e.g., dielectric constant and coefficient of thermal expansion, do not vary more than about 5% throughout the article.

In preferred embodiments, the composition of U.S. Pat. No. 5,223,568 further includes a crosslinking agent capable of co-curing (i.e., forming covalent bonds) with the polybutadiene or polyisoprene resin thermoplastic elastomer, or both. Examples of preferred crosslinking agents include triallylcyanurate, diallylphthlate, divinyl benzene, a multifunctional acrylate, or combinations of these agents.

When the electrical substrate material disclosed in U.S. Pat. No. 5,223,568 includes a dielectric filler, the volume % of the filler (based upon the combined volume of resin, thermoplastic elastomer, crosslinking agent, if any, and filler) is between 5 and 80%, inclusive. Examples of preferred fillers include titanium dioxide (rutile and anatase), barium titanate, strontium titanate, silica (particles and hollow spheres); corundum, wollastonite, polytetrafluoroethylene, aramide fibers (e.g., Kevlar), fiberglass, $Ba_2Ti_9O_{20}$, glass spheres, quartz, boron nitride, aluminum nitride, silicon carbide, beryllia, or magnesia. They may be used alone or in combination.

The method disclosed in U.S. Pat. No. 5,223,568 provides a wide variety of shaped articles having favorable isotropic thermal and dielectric properties. These properties can be tailored to match or complement those of ceramic materials, including gallium arsenide, alumina, and silica. Thus, the cured articles can replace ceramic materials in many electronic and microwave applications, for example, as specialized substrates for high speed digital and microwave circuits. Examples of microwave circuits include microstrip circuits, microstrip antennas, and stripline circuits. The cured products are also useful as rod antennas and chip carriers.

While well suited for its intended purposes, the circuit laminate materials described in U.S. Pat. No. 5,223,568 do suffer from several drawbacks. For example, these prior art materials require a high temperature cure (e.g., lamination) of greater than about 250° C. (482° F.); and this requirement is problematic for several reasons. First, conventional circuit fabrication equipment often exhibit temperature limits of 360° F. (182° C.), which is below that of the 482° F. (250° C.) requirement. Still another drawback is that flammability ratings required by Underwriters Laboratory UL 94-VO lead to the need for inclusion of a flame retardant additive such as a bromine-containing fire retardant. Unfortunately, typical bromine-containing fire retardant additives cannot withstand the high temperature cure conditions of greater than 250° C., undergoing decomposition and/or chemical degradation at these temperatures.

In addition to the foregoing need for lowering the cure (lamination) temperature of the circuit laminates, there is also a problem with the inherent tackiness associated with the polybutadiene or polyisoprene laminate prepregs. Because of the tacky nature of the prepreg, it is not practically feasible to use a continuous, automated layup process for laminating circuit materials. Roll lamination equipment is commonly available, however, and the ability to provide a polybutadiene or polyisoprene based prepreg of the type described in U.S. Pat. No. 5,223,568 which is also usable in an automatic layup process would greatly reduce the manufacturing cost and processing time, leading to a significant increase in the commercial success of the resultant circuit material products.

In addition to U.S. Pat. No. 5,223,568, there are other prior art patents and literature of some interest which respect to the use of filled circuit laminates in general, and polybutadiene based circuit laminates in particular. For example, in an article entitled "A New Flame Retardant 1,2-Polybutadiene Laminate" by N. Sawatari et al., IEEE Transactions on Electrical Insulation, Vol. EI-18, No. 2, Apr. 1983, the limitations on presently-used polybutadiene based laminates is discussed, including the fact that 1,2-polybutadiene (PBD) is difficult to control in the semicured condition (the B-stage), difficult to make non-tacky, highly flammable, and exhibits low copper bond. The article thereafter describes a composition which addresses these issues.

The composition described uses a high percentage of very high molecular weight PBD to eliminate tackiness and B-staging. Also, a low molecular weight, modified PBD resin is used as a minor component to aid in copper bond and flow during lamination. There is no mention of using filler of any type.

U.S. Pat. No. 5,264,065 to Kohm describes a base material for printed wiring boards where inert filler is used to control Z-axis coefficient of thermal expansion (CTE) in fiberglass-reinforced thermoset resins. The Kohm patent discloses a range of 45–65 weight % fiberglass reinforcement and a range of 30 to 100 parts filler per 100 parts of the polymer. There is no disclosure in Kohm of a polybutadiene or like material for the resin system.

U.S. Pat. No. 4,997,702 to Gazit et al. discloses a circuit laminate having an epoxy resin system which also includes inorganic fillers or fibers in the range of 20–70 weight % of the total composite. The fibers include both glass and polymeric fibers and the fillers include clay or mineral (e.g. silica) particulate fillers.

U.S. Pat. No. 4,241,132 to Pratt et al. discloses an insulating board comprising a polymeric matrix such as polybutadiene and a filler consisting of polymeric filler, for example fibrous polypropylene. In all cases, the dielectric constant or dissipation factor of the resin matrix is matched to the fibrous reinforcement in order to obtain an isotropic composite.

European Patent No. 0 202 488 A2 discloses a polybutadiene-based laminate wherein a high molecular weight, bromine-containing prepolymer is used to reduce tack and flammability of a 1,2-polybutadiene resin. Similarly, in Japanese Patent No. 04,258,658, a high molecular weight compound is added to a tacky PBD resin to control tack. The compound utilized is a halogen-containing bismaleimide which provides flammability resistance, as well as good copper bonding and heat resistance. There is no mention of the use of fillers and the resulting laminate will have a relatively high dissipation factor.

An article entitled "1,2-Polybutadienes-High Performance Resins for the Electrical Industry", by R. E. Drake, ANTEC '84 pp. 730–733 (1984), generally discloses conventional polybutadiene resins for use in laminates and specifically discloses the use of reactive monomers to co-cure with the PBD.

U.K. Patent Application No. 2 172 892 A generally discloses laminates composed of styrene-containing and thermoplastic copolymers with unsaturated double bonds and polybutadiene.

Notwithstanding the foregoing examples of laminate composites, there continues to be a need for improved polybutadiene laminates having a combination of electrical, chemical, mechanical and thermal properties which are not presently available including flame retardance, improved CTE, ability to tailor dielectric constant, improved dissipation factor, low cost and low tackiness.

SUMMARY OF THE INVENTION

The above-discussed and other drawbacks and deficiencies of the prior art are overcome or alleviated by the electrical substrate material of the present invention. In accordance with one embodiment of the present invention, an electrical substrate material is provided which comprises a thermosetting matrix which includes a polybutadiene or polyisoprene resin and an unsaturated butadiene or isoprene containing polymer in an amount of 25 to 50 volume percent; a woven glass fabric in an amount of 10 to 40 volume %; a particulate, preferably ceramic, filler in an amount of from 5 to 60 volume %; a flame retardant; and a peroxide cure initiator. A preferred composition has 18% woven glass, 41% particulate filler and 30% thermosetting matrix.

The foregoing component ratios, and particularly the relatively high range of particulate filler, is an important feature of this invention in that this filled composite material leads to a prepreg which has very little tackiness and can therefore be easily handled by operators. This low tackiness feature allows for the use of conventional automated layup processing, including foil cladding, using one or more known roll laminators. While the prepreg of this invention is tack-free enough to be handled relatively easily by hand, it is also tacky enough to be tacked to itself using a roll laminator (e.g., nip roller) at room temperature. In addition, another important feature of this invention is the low amount of glass fabric filler relative to the higher range of particulate filler which leads to improved (lower) CTE in the Z axis or thickness direction, improved electrical performance (e.g., dissipation factor), lower cost and the ability to tailor dielectric constant through appropriate selection of particulate fillers.

Still another important feature of this invention is that the cure temperature for lamination is significantly lower than required by U.S. Pat. No. 5,223,568 with lamination temperatures typically in the range of 330 to 425° F. The low temperature cure conditions allow for the use of bromine containing fire retardant additives as well as permitting the use of conventional circuit fabrication (e.g., lamination) equipment. The relatively low temperature cure is achieved using an appropriate amount of organic peroxide such as dicumyl peroxide and t-butyl perbenzoate peroxide.

In accordance with another embodiment of the present invention, an electrical substrate material is provided which comprises a thermosetting matrix which includes a single resin, polybutadiene or polyisoprene resin, in an amount of 25 to 50 volume %; a woven glass fabric in an amount of 10 to 40 volume %; and a particulate filler in an amount of from 5 to 60 volume %. A preferred composition has 18% woven glass, 41% particulate filler and 30% thermosetting matrix. Preferably, the composition further comprises a high surface area filler, preferably fumed silica, to reduce tack; a flame retardant; and a peroxide cure initiator.

The electrical substrate material of this invention includes a plurality of woven webs (such as E-glass webs) embedded in a mixture of the polybutadiene or polyisoprene based resin system and inorganic filler (e.g., silica) laminated between one or two sheets of conductive foils (e.g., copper) to produce a circuit board material which is especially well suited for microwave applications. Of course, if very thin (e.g., less than 3 mil thickness) cross-sections are desired, then only a single saturated web may be used for the dielectric.

The above-discussed and other features and advantages of the present invention will be appreciated and understood by those of ordinary skill in the art from the following detailed description and drawings.

BRIEF DESCRIPTION OF THE DRAWINGS

Referring now to the drawings, wherein like elements are numbered alike in the several FIGURES.

DESCRIPTION OF THE PREFERRED EMBODIMENT

The present invention comprises a thermosetting matrix in the amount of 25 to 50 volume %, a woven glass fabric in the amount of 10 to 40 volume %, and inorganic particulate filler in the amount of 5 to 60 volume %. In addition, the present invention includes one or more organic peroxide initiators in an amount of 1.5 to 6 parts per hundred resin (phr) and a bromine-containing fire retardant additive in an amount effective to provide fire retardance.

The resin system, fillers, cross-linking agents, woven web, fire retardant additives, peroxide initiators, processing conditions and representative constructions together with Examples will now be discussed in detail.

Resin System

In one embodiment of the present invention, the resin system used in the electrical substrate material of this invention is a thermosetting composition generally comprising (1) a polybutadiene or polyisoprene resin (or mixture thereof); and (2) an unsaturated butadiene or isoprene-containing polymer capable of participating in cross-linking with the polybutadiene or polyisoprene resin during cure. The polybutadiene or polyisoprene resins may be liquid or solid at room temperature. Liquid resins may have a molecular weight greater than 5,000 but preferably have a molecular weight of less than 5,000 (most preferably between 1,000 or 3,000). The preferably liquid (at room temperature) resin portion maintains the viscosity of the composition at a manageable level during processing. It also crosslinks during cure. Polybutadiene and polyisoprene resins having at least 90% 1,2 addition by weight are preferred because they exhibit the greatest crosslink density upon cure owing to the large number of pendent vinyl groups available for crosslinking. High crosslink densities are desirable because the electrical circuit substrates exhibit superior high temperature properties. A preferred resin is B3000 resin, a low molecular weight polybutadiene liquid resin having greater than 90 weight % 1,2 addition. B3000 resin is commercially available from Nippon Soda, Ltd.

The unsaturated polymer preferably comprises a thermoplastic elastomer and more preferably includes a linear or graft-type block copolymer that preferably has a polybutadiene or polyisoprene block with at least 50% by weight, 1,2 addition and a thermoplastic block that preferably is styrene or α-methyl styrene. The high proportion of 1,2-addition in the polyisoprene or polybutadiene block leads to high crosslink densities after the curing step, as is the case with the polybutadiene or polyisoprene resin described above. A preferred copolymer is a styrene-butadiene-styrene triblock copolymer, e.g., Kraton DX1300 (commercially available from Shell Chemical Corp.).

The thermoplastic elastomer may also contain a second block copolymer similar to the first except that the polybutadiene or polyisoprene block is hydrogenated, thereby forming a polyethylene block (in the case of polybutadiene) or an ethylene-propylene copolymer (in the case of polyisoprene). When used in conjunction with the first copolymer, materials with greater "toughness" can be produced. Where it is desired to use this second block copolymer, a preferred material is Kraton GX1855 (commercially available from Shell Chemical Corp.) which is believed to be a mixture of styrene-high 1,2 butadiene-styrene block copolymer and styrene-(ethylene-propylene)-styrene block copolymer. Particularly preferred compositions are those in which the resin is polybutadiene, the first block copolymer is styrene-butadiene-styrene triblock copolymer (m=n=1), and the second block is styrene-(ethylene-propylene)-styrene triblock copolymer (m=n=1), the ethylene-propylene block being the hydrogenated form of an isoprene block.

Thus, in a preferred embodiment, the unsaturated polymer comprises a solid thermoplastic elastomer block copolymer having the formula $X_m(Y-X)_n$ (linear copolymer) or (graft polymer) where Y is a polybutadiene or polyisoprene block, X is a thermoplastic block, and m and n represent the average block numbers in the copolymer, m being 0 or 1 and n being at least 1. The composition may further include a second thermoplastic elastomer block copolymer having the formula $W_p-(Z-W)_q$ (linear copolymer) or (graft copolymer) where Z is a polyethylene or ethylene-propylene copolymer block, W is a thermoplastic block, and p and q represent the average block numbers in the copolymer, p being 0 and 1 and q being at least 1.

Preferably, the polybutadiene or polyisoprene resin and the polybutadiene or polyisoprene block of the first block copolymer making up the thermoplastic elastomer have at least 90% by weight 1,2 addition. The volume to volume ratio of the polybutadiene or polyisoprene to the thermoplastic elastomer preferably is between 1:9 and 9:1, inclusive.

Other free radical curable polymers which can co-cure with butadiene polymers may be added (such that 1,2-butadiene polymers are still the major polymeric ingredient) for specific property or processing modifications. Such possible modification purposes include toughness, adherability to copper foil and copper plating, and prepreg handling characteristics. These co-curable polymers include random and block copolymers of primarily 1,3-addition butadiene or isoprene with styrene, alpha-methyl styrene, acrylate or methacrylate, or acrylonitrile monomers; homopolymers or copolymers of ethylene, such as polyethylene, ethylene-propylene copolymer and ethylene-propylene-diene terpolymers, ethylene-ethylene oxide copolymers; natural rubber; norbornene polymers such as polydicyclopentadiene; hydrogenated diene polymers such as hydrogenated styrene-isoprene-styrene copolymers and butadiene-acrylonitrile copolymers; and others. Levels of these co-curable polymers should be less than 50% of the total polymeric component.

In still another preferred embodiment of the present invention, the resin system comprises only a single resin, i.e., either polybutadiene or polyisoprene alone, without a second polymeric component. As with the two-component resin systems, the polybutadiene or polyisoprene resins may be liquid or solid at room temperature. Liquid resins may have a molecular weight greater than 5,000 but preferably have a molecular weight of less than 5,000 (most preferably between 1,000 or 3,000). The preferably liquid (at room temperature) resin portion maintains the viscosity of the composition at a manageable level during processing.

Polybutadiene and polyisoprene resins having at least 90% 1,2 addition by weight are preferred because they exhibit the greatest crosslink density upon cure owing to the large number of pendent vinyl groups available for crosslinking. High crosslink densities are desirable because the electrical circuit substrates exhibit superior high temperature properties. A preferred resin is B3000 resin, a low molecular weight polybutadiene liquid resin having greater than 90 weight % 1,2 addition. B3000 resin is commercially available from Nippon Soda, Ltd.

Particulate Filler Material

The volume % of the filler (based upon the combined volume of the resin system, woven fabric and particulate filler) is between 5 and 60%, inclusive and preferably between 30% and 50%. Examples of preferred fillers include titanium dioxide (rutile and anatase), barium titanate, strontium titanate, silica (particles and hollow spheres) including fused amorphous silica and fumed silica; corundum, wollastonite, aramide fibers (e.g., Kevlar), fiberglass, $Ba_2Ti_9O_{20}$, glass spheres, quartz, boron nitride, aluminum nitride, silicon carbide, beryllia, alumina or magnesia. They may be used alone or in combination.

In an important and preferred feature of this invention, the particulate filler is present in an amount which is (1) greater than the amount (in volume %) of thermosetting composition (preferably the ratio of filler to thermosetting composition is 45:55) and (2) greater than the amount (in volume %) of the woven fabric.

Particularly preferred fillers are rutile titanium dioxide and amorphous silica because these fillers have a high and low dielectric constant, respectively, thereby permitting a broad range of dielectric constants combined with a low dissipation factor to be achieved in the final cured product by adjusting the respective amounts of the two fillers in the composition. To improve adhesion between the fillers and resin, coupling agents, e.g., silanes, are preferably used.

As will be discussed hereinafter, the material described herein is preferably used as a dielectric substrate in a circuit laminate wherein a layer of metal is laminated thereto. Preferably, the filler material and quantity thereof is selected so as to provide the substrate with a coefficient of thermal expansion which is equal or substantially equal to the coefficient of thermal expansion of the metal layer.

With respect to the single resin embodiment of the present invention, a very high surface area particulate filler such as fumed silica may be additionally used to prevent tackiness and stickiness in the prepreg. The preferred fumed silica is available from Degussa under the trade name AEROSIL 200, and has a surface area of around 200 $m^2/g$, with a typical primary particle size of 12 nm.

The amount of fumed silica used may be in the range from about 0.2 volume % to about 5 volume percent, and preferably in the range from about 0.5 volume % to about 1.5 volume %. Thus, the loading level of such silica may be as low as 1% by weight and still yield a prepreg with very similar tack characteristics to those found in the two-component system. Apparently, such very high surface area silica is much more effective at reducing tack than the standard sized amorphous silica (10 $\mu m$ median), as the addition of only about 1% fumed silica made a large reduction in tack to a prepreg already containing 66% amorphous silica.

Woven Web

The fiber reinforcement comprises woven, thermally stable webs of a suitable fiber, preferably glass (E, S, and D glass) or high temperature polyester fibers (e.g., KODEL from Eastman Kodak). The web is present in an amount of about 10 to 40 volume %, and preferably about 15 to 25 volume % with respect to the entire laminate. Such thermally stable fiber reinforcement provides the laminate with a means of controlling shrinkage upon cure within the plane of the laminate. In addition, the use of the woven web reinforcement renders a dielectric substrate with a relatively high mechanical strength.

Preferred examples of the woven fiberglass web used in the present invention are set forth in the following Table:

| FIBERGLASS WOVEN WEBS | | |
| --- | --- | --- |
| Manufacturer | Style | Thickness (in.) |
| Fiber Glast | 519-A | 0.0015 |
| Clark-Schwebel | 112 | 0.0032 |
| Clark-Schwebel | 1080 | 0.0025 |
| Burlington | 106 | 0.0015 |
| Burlington | 7628 | 0.0068 |

Fire Retardant Additive

Preferably, the present invention includes a flame retardant such as a bromine-containing flame retardant in an amount of 20 to 60 phr. Examples of suitable brominated flame retardants include Saytex BT 93W (ethylene bistetrabromophthalimide), Saytex 120 (tetradecabromodiphenoxy benzene) or Saytex 102 (decabromo diphenoxy oxide).

Curing Agent

A curing agent is added to the composition to accelerate the curing reaction. When the composition is heated, the curing agent decomposes to form free radicals, which then initiate crosslinking of the polymeric chains. Preferred curing agents are free radical cure initiators such as organic peroxides, e.g., dicumyl peroxide, t-butylperbenzoate and t-butylperoxy hexyne-3, all of which are commercially available. The peroxide curing agent is provided in an amount of between 1.5 and 6 phr.

Processing

In general, the two-component thermosetting compositions are processed as follows. First, the polybutadiene or polyisoprene resin, thermoplastic elastomer, particulate fillers, curing agents, flame retardants, and coupling agent (if any) are thoroughly mixed to form a slurry in conventional mixing equipment. The mixing temperature is regulated to avoid substantial decomposition of the curing agent (and thus premature cure). Mixing continues until the particulate filler is uniformly dispersed throughout the resin. The particulate filler may be pretreated with coupling agents (preferably silanes) in a separate step for more efficient use of the agents.

Next, conventional prepreg manufacturing methods can be employed. Typically the web is impregnated with the slurry, metered to the correct thickness, and then the solvent is removed (evaporated) to form a prepreg.

Figure 1:
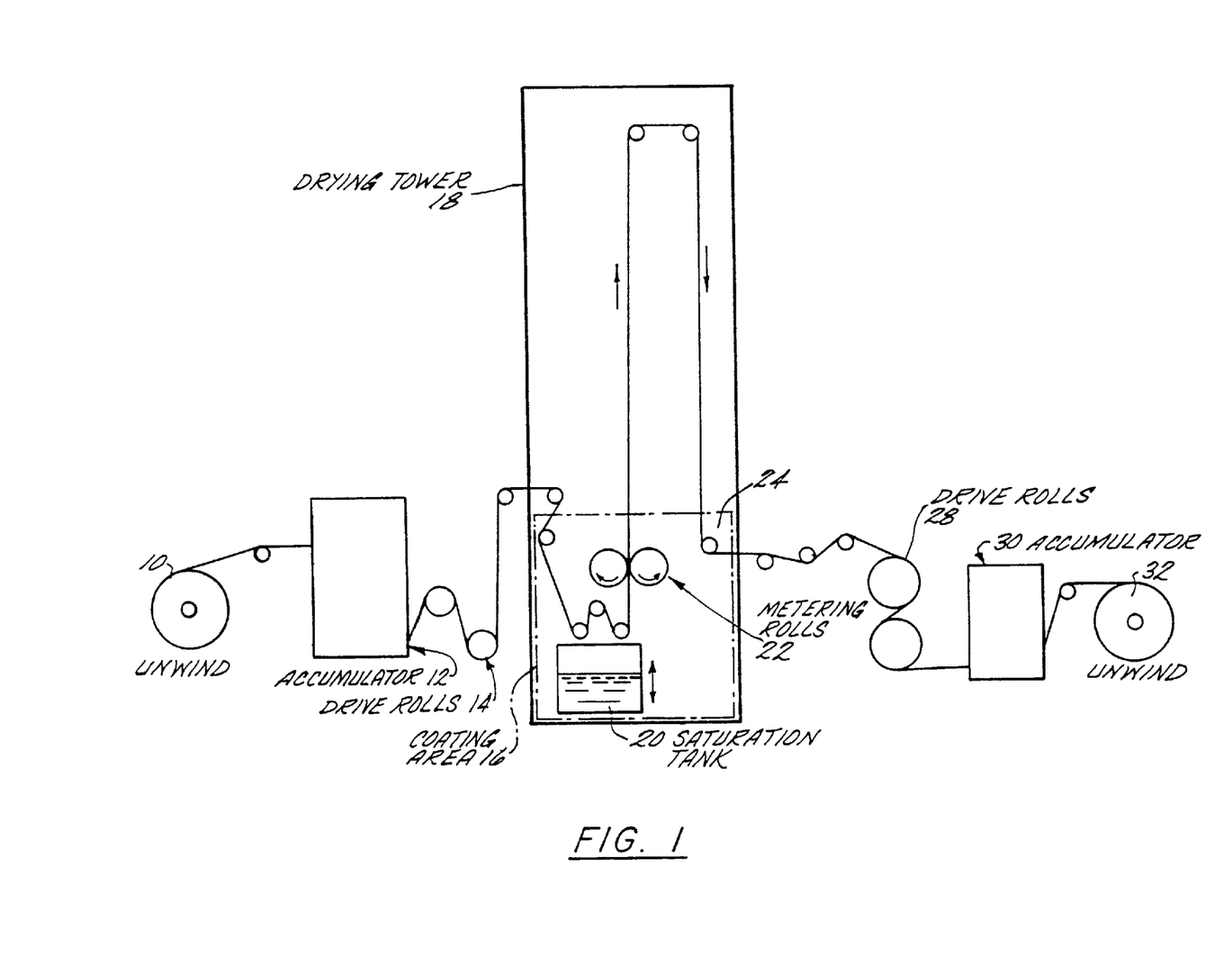
FIG. 1 is a schematic representation of a processing line for the continuous manufacture of the prepreg in accordance with the present invention.

One processing system useful in making a prepreg in accordance with the present invention is shown in FIG. 1 and includes (from left to right) a roll 10 of woven glass web 11 which unwinds through a first accumulator 12 to a series of drive rolls 14. The web 11 then passes into the coating area 16 where the web is passed through a saturation tank 20 (which contains the mixture of polymer, particulate filler, solvent and other components) and then through a pair of metering rolls 22. The web 11 thereafter travels the length of a drying tower 18 for a selected period of time until the solvent is evaporated from the web whereupon the web passes through drive rolls 28, a second accumulator 30 and finally web 11 (which is now a prepreg) is wound onto roll 32.

The lamination process entails a stack-up of one or more prepreg layers between one or two sheets of conductive foil (copper). This stack-up is then densified and cured via lamination or a combination of lamination and oven baking.

The stack-up is cured in a conventional peroxide cure step; typical cure temperatures are between 330 and 425° F. (165 to 218° C.). In accordance with an important feature of this invention, unlike U.S. Pat. No. 5,223,568, no additional high temperature cure step is needed to increase crosslink density. It will be appreciated that the '568 patent requires a high temperature cure where the temperature is greater than about 250° C. but less than the decomposition temperature of the resin (typically about 400° C.).

Figure 2:
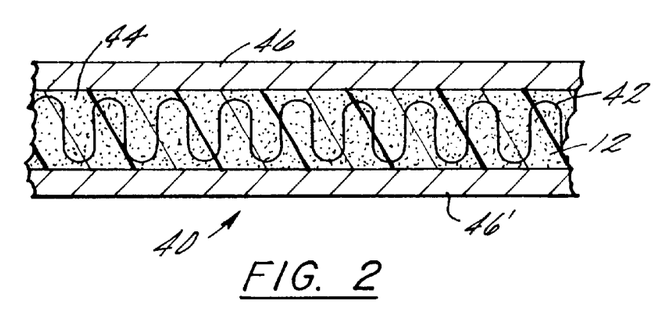
FIG. 2 is a cross-sectional elevation view of a circuit substrate material in accordance with the present invention.

Referring now to FIG. 2, a cross-sectional view of electrical substrate material in accordance with the present invention is shown generally at 40. Electrical substrate 40 has been laminated in accordance with one of the processes described above wherein a woven web 42 is impregnated with a resin system/filler composition 44 and laminated between two copper foils 46, 46' to produce a circuit board laminate. As discussed above with reference to the processing conditions, the resin system 44 may either be cast onto woven web 42 using known prepreg manufacturing equipment or web 42 may be saturated by resin system 44 by sandwiching web 42 between a pair of bond plys formed from resin system 44 and laminating the stack up together with the copper cladding 46, 46'. While FIG. 2 depicts a single layer of woven web 42, it will be appreciated that typically a plurality of layers of saturated web 12 will be used in forming circuit laminates in accordance with the present invention. However, a single layer as shown in FIG. 2 is desirable where very thin cross-sections (less than 3 mils) are required.

With respect to the single-resin embodiment according to the present invention, processing and laminate production was similar to the methods described above. Thus, the components were mixed with solvent (xylene), saturated onto 1080 fiberglass, and dried at room temperature to make prepregs. These prepregs were then stacked (6 layers), placed between sheets of 1 -oz. ED copper foil and laminated according to the above procedures. Initially, typical lamination conditions were used, i.e., heating at 350° F. for 1.5 hours at 350 psi (Samples 6 and 7). However, the properties of samples laminated at 350 psi indicated that the samples were not being fully densified: the specific gravity, dielectric constant, and copper adhesion were all low. For this reason, samples were also laminated at 989 psi (Example 8). The resulting laminates displayed considerably better copper adhesion, as well as more typical specific gravity and dielectric strength values. The low dielectric strength and dissipation factor values were still not optimal, probably due to the tendency of the fumed silica to adsorb moisture onto its surface. (The manufacturer's literature in fact states that up to 1.5% by weight of the silica could be water.) Either a pre-drying or surface treatment step using silane or other hydrophobic coating may be employed to resolve these problems. Any silane or other hydrophobic coating would need to be compatible with the resin system of the present invention.

EXAMPLES

The following non-limiting examples further describe the electrical substrate material of the present invention.

A. Tackiness

In an effort to quantify the tackiness of the prepreg of this invention, a peel test was developed and applied to a number of samples.

Test Description

Attempting to simulate a 90° peel test, an Instron (Model 1125) was used to peel apart 2 layers of prepreg. The individual layers of prepreg were 1" wide and 12" long and were stuck together by rolling a 10 lb roller over them in the lengthwise direction. A 50 lb tensile load cell was used in conjunction with a 15 inches/minute crosshead speed to measure the peel force or tack. For verification of the data, the tests were duplicated using a 10 lb cell and 12 ipm.

Test Samples

Four prepreg formulations were created for this test as shown in the table below. Using only 106 style fiberglass, prepregs were made in which the particulate filler, resin and rubber contents varied.

|  | Prepreg Component, % by volume | | | | |
|---|---|---|---|---|---|
| Sample No. | Filler | Resin (PBD) | Rubber (SBS) | Woven Glass | Other |
| 2075-62-1 | 25 | 32 | 20 | 18 | 5 |
| 2075-62-2 | 34 | 26 | 16 | 18 | 6 |
| 2075-62-3 | 25 | 41 | 11 | 18 | 5 |
| 2075-62-5 | 34 | 34 | 9 | 18 | 5 |

Results

Figure 3:
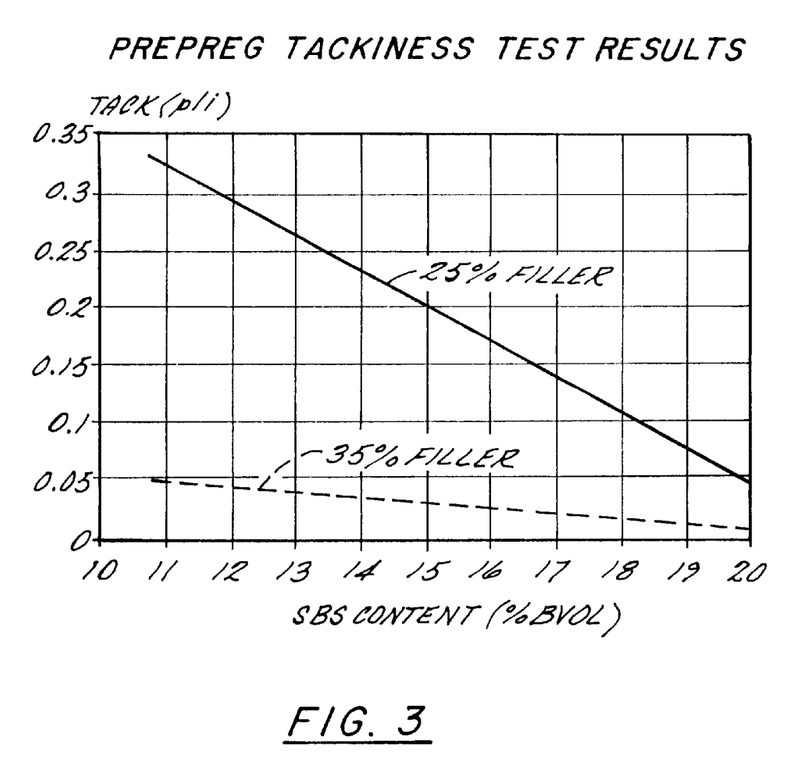
FIGS. 3–5 are test data depicting the improved (lower) tackiness of the B-staged circuit substrate in accordance with the polybutadiene or polyisoprene/unsaturated polymer embodiment of the present invention.
Figure 4:
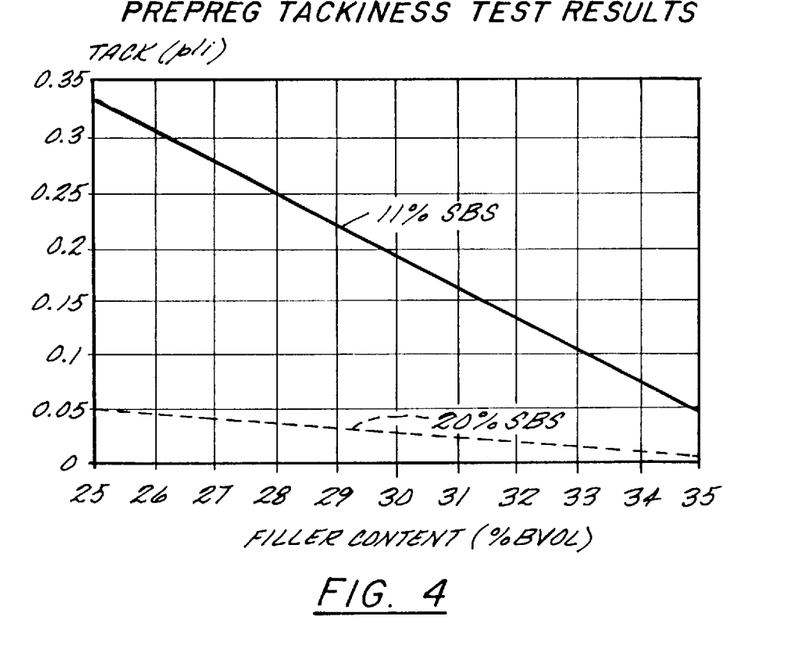
Figure 5:
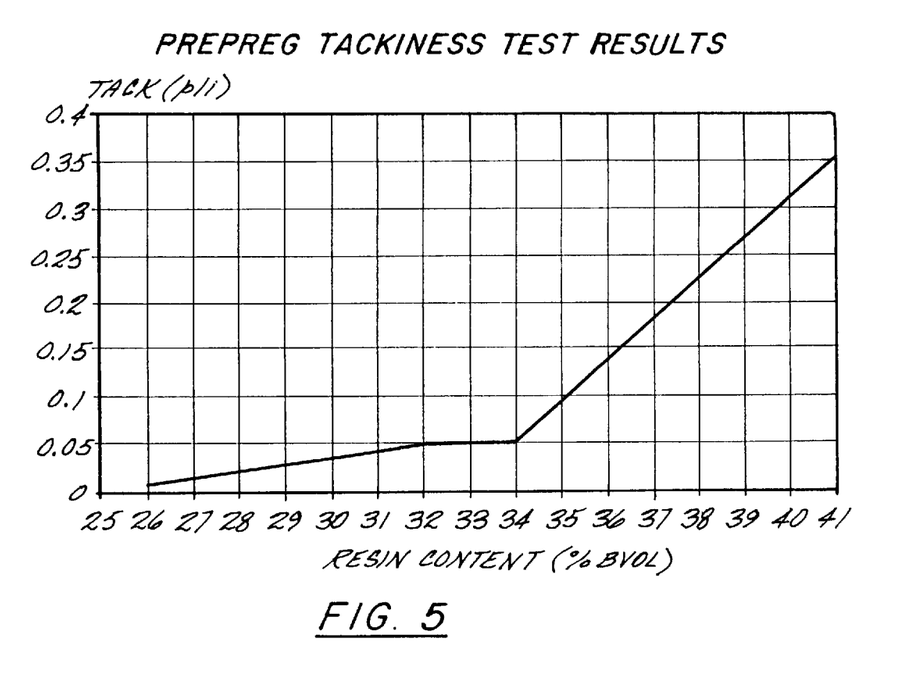

The measured peel values range from 0 to 0.35 pli. FIG. 3 plots the tack versus SBS (rubber) content for the two filler loadings used. From this plot, the resulting tack is more sensitive to rubber content at the lower filler loading. Alternatively, FIG. 4 plots the tack versus filler content. In this case, the resulting tack is more sensitive to filler content at the lower rubber loading. FIGS. 3 and 4 lead to the conclusion that the combination of filler and rubber volumes effect tack. If one looks at the resulting resin contents versus tack (FIG. 5), there is a good correlation between resin volume present and tack. Put simply, it appears that an important factor for tackiness is the amount of resin present and to reduce tack it does not matter whether the resin is displaced by filler or rubber so long as the resin is displaced.

B. Two-Component Polybutadiene/Polyisoprene Example Formulations

The following five examples show representative electrical, thermal and mechanical data for the two-component laminates of the present invention. In accordance with an important feature of this invention, the dissipation factor of the resultant laminate is less than or equal to 0.007, which renders this material well suited for use in microwave applications.

Example 1

This is a preferred embodiment. The laminate consisted of five layers of prepreg for a total dielectric thickness of 0.023 inches (") Note the high filler and low rubber contents.

Example 2

This sample contained a particulate filler loading lower than the preferred embodiment but had a higher rubber content. The laminate was made with five layers of 1080 woven glass resulting in a dielectric thickness of 0.021".

Example 3

This sample contained titania (TiO$_2$) particulate filler compared to the silica (SiO$_2$) found in the other examples. The laminate contained 10 layers of 1080 woven glass resulting in a dielectric thickness of 0.028".

Example 4

This laminate had the rubber replaced in the formulation with more resin. The laminate's construction utilized four layers of 1080 woven glass and resulted in a dielectric thickness of 0.016".

Example 5

This sample contained more rubber than resin. The resulting laminate was 0.020" thick and utilized five layers of 1080 woven glass.

| Component, Source (% by total weight) | Sample No. | | | | |
|---|---|---|---|---|---|
| | 1 | 2 | 3 | 4 | 5 |
| Formulations, Examples 1–5 | | | | | |
| B3000 Resin, Nippon Soda | 14.6 | 13.5 | 12 | 21.2 | 4.4 |
| D1300 (Kraton) Rubber, Shell | 3.8 | 9.3 | 3 | 0 | 13.1 |
| FB-35 Fused Silica, Denka | 0 | 44.7 | 0 | 0 | 51.3 |
| Minsil 5 Fused Silica, Minco | 51 | 0 | 0 | 45.7 | 0 |
| Ticon HG Titania, TAM | 0 | 0 | 53.2 | 0 | 0 |
| Woven Glass, Clark-Schwebel | 25 | 26 | 27 | 26 | 25 |
| Silane | 0.5 | 0.4 | 0.6 | 0.4 | 0.5 |
| Brominated Flame Retardant | 4.5 | 4.6 | 3.7 | 5.3 | 4.4 |
| Catalyst (peroxide) | 0.6 | 1.5 | 0.5 | 1.4 | 1.3 |
| Properties, Examples 1–5 | | | | | |
| Dielectric Constant* | 3.47 | 3.35 | 9.54 | 3.22 | 3.42 |
| Dissipation Factor** | 0.0035 | 0.0042 | 0.0059 | 0.0053 | 0.0035 |
| Specific Gravity (g/cc) | 1.83 | 1.75 | 2.47 | 1.76 | 1.83 |
| Copper Bond (pli) | 4.4 | 5 | 2.1 | 3.2 | 3.7 |
| Water Absorption (% wt) | N/A | 0.09 | N/A | N/A | 0.67 |

*Dielectric constant (Dk) values are the averages of the measured Dk's from a 1–10 Ghz frequency sweep.
**Dissipation Factor (Df) values are the lowest recorded value of a given 1–10 Ghz frequency sweep.
Specific gravity test method: ASTM D792-91
Copper bond: IPC-TM-650 2.4.8
Water absorption IPC-TM-650 2.6.2.1 (with 48 hr exp.)

In general, the preferred formulations of the present invention minimize fiber content and maximize particulate filler content. This high particulate filler content (preferred ratio of resin to filler is 45:55) leads to improved (lower) CTE in the Z-axis direction, improved electrical performance, lower cost and other features and advantages. While the prior art discussed above generally discloses filled polybutadiene laminates and laminates based on other resin systems which employ fiber and particulate fillers, no prior art to which Applicants are aware utilize the combination of:

1. thermosetting matrix comprised of polybutadiene or polyisoprene resin and an unsaturated butadiene or isoprene containing polymer in an amount of 25 to 50 volume %

2. woven fabric reinforcement in an amount from 10 to 40 volume %; and 3. particulate filler in an amount of 5 to 60 volume %.

In general, the present invention utilizes a higher particulate filler level and a lower woven fabric level. Preferably, the use in the thermosetting composition of a high molecular weight copolymer permits the use of these higher levels of particulate fillers, all of which leads to improved rheological control, reduced tack and reduced shrinkage. More particularly, the combination of an extremely high loading level of particulate filler, woven glass and an unsaturated polymer while still being processable using standard industry equipment represents an important advance in the circuit materials field. In addition, the unexpected result that the particulate filler can be used to eliminate tackiness of the liquid polybutadiene resin represents still another important feature of this invention

C. Single Resin Polybutadiene/Polyisoprene Formulations

The following examples show representative electrical, thermal, and mechanical data on the preferred single resin embodiment of the laminate of the present invention, wherein only a single resin system comprising a polybutadiene or a polyisoprene resin is used. The entire SBS rubber portion of the formulation is replaced on a weight basis with additional liquid resin.

Example 6

The final laminate properties of this example, where the unsaturated rubber component is replaced by liquid resin on a weight basis, are very similar to those of the two-component system. The key differences are a loss of flexural strength and an increase in flexural modulus, as well as an increase in xylene absorption. Since the unsaturated rubber component can act as a toughening agent, the changes in flexural properties are expected. However, direct replacement of the unsaturated rubber component with additional liquid resin resulted in very tacky, sticky prepregs. This level of tack can pose handling problems in some applications.

Example 7

In this Example, very high surface area fumed silica has been added to the composition, thereby eliminating tack and stickiness in the prepreg. Lamination was performed at 350 psi. Except for dissipation factor and dielectric strength, the resulting materials have very similar properties to those observed in the above-described two-component system. Additional treatment of the fumed silica may improve these properties.

Example 8.

In this Example, lamination of a single resin system containing fumed silica was laminated at 989 psi.

Example 9.

Example 9 is a representative two-component resin system according to the invention described above, comprising a polybutadiene or polyisoprene resin and an unsaturated polymer, included for comparison purposes.

| Component, Source | Sample No. | | | |
|---|---|---|---|---|
| (% by total weight) | 6 | 7 | 8 | 9 |
| Formulations, Examples 6–9 | | | | |
| B3000 Resin, Nippon Soda | 16.9 | 16.7 | 16.7 | 12.6 |
| CE44I Amorphous Silica, CE Minerals | 49.5 | 49 | 49 | 46.2 |
| Aerosil 200 Fumed Silica, Degussa | — | 0.7 | 0.7 | — |
| A174 Silane, OSI | 0.5 | 0.5 | 0.5 | 0.4 |
| Luperox 500R Catalyst, Elf Atochem | 0.7 | 0.7 | 0.7 | 0.6 |
| BT-93W Flame Retardant, Albemarle | 7.4 | 7.4 | 7.4 | 7.0 |
| 850BD (Vector) Rubber, Dexco | — | — | — | 3.2 |
| Woven Glass, Clark-Schwebel | 25 | 25 | 25 | 30 |
| Properties, Examples 6–9 | | | | |
| Lamination Pressure (psi) | 350 | 350 | 989 | 350 |
| Thickness (mils) | 23.4 | 23 | 24 | 20 |
| Copper Bond (pli) | 5.0 | 3.0 | 4.8 | 5.4 |
| % Bow (after etch on one side) | 7.2 | 7.1 | 5.6 | 6.0 |
| % Twist (after etch on one side) | 6.3 | 6.3 | 6.9 | 5.0 |
| Dielectric Strength (V/mil) | 783 | 688 | 631 | 800+ |
| Specific Gravity (g/cc) | 1.89 | 1.79 | 1.86 | 1.86 |
| MD Flexural Strength (Kpsi) | 27.2 | 28.3 | 31.3 | 33.5 |
| CMD Flexural Modulus (Kpsi) | 23.8 | 21.6 | 26.3 | 28.0 |
| Dielectric Constant* | 3.40 | 3.25 | 3.46 | 3.45 |
| Dissipation Factor** | 0.0041 | 0.0045 | 0.0055 | 0.0040 |
| Xylene Absorption (% wt) | 2.55 | 1.98 | 1.87 | 1.60 |

*Dielectric constant (Dk) values are the averages of the measured Dk's from a 1–10 Ghz frequency sweep.
**Dissipation Factor (Df) values are the lowest recorded value of a given 1–10 Ghz frequency sweep.
*Specific gravity test method: ASTM D792-91
Copper bond: IPC-TM-650 2.4.8
Xylene absorption IPC-TM-650 2.6.2.1 (with 48 hr exposure)

The above Examples 6–9 demonstrate that a single resin composition according to the present invention can be used to form circuit board laminates with desirable properties. With the addition of a small amount of a high surface area particulate, preferably fumed silica, the composition is readily workable for manual and automated handling, and thus economical to prepare.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A laminate for making an electrical circuit comprising:
   (1) a substrate material having two opposed surfaces and including:
      (a) a thermosetting composition consisting essentially of a polybutadiene or polyisoprene resin and at least one unsaturated polymer capable of participating in crosslinking with the polybutadiene or polyisoprene resin, the polybutadiene and polyisoprene resin being chemically distinct from the at least one polymer;
      (b) a woven fabric in an amount greater than about 10 percent of the substrate material; and
      (c) a particulate filler in an amount greater than about 5 volume percent of the substrate material; and
   (2) a conductive material laminated to at least a portion of at least one of the opposed surfaces of said substrate material,
   at least said thermosetting composition and said particulate filler having been formed into a prepreg sheet prior to being laminated, and wherein curing of said substrate material occurs when said conductive material is laminated under heat and pressure to said substrate.

2. The substrate material of claim 1, wherein:
the unsaturated polymer is a solid thermoplastic elastomer block copolymer.

3. The substrate material of claim 1 wherein:
the particulate filler is present in an amount by volume which is greater than the amount by volume of the woven fabric.

4. The substrate material of claim 1 wherein:
the particulate filler is present in an amount by volume which is greater than the amount by volume of the thermosetting composition.

5. The substrate material of claim 1 wherein:
the particulate filler comprises a high surface area particulate filler in an amount of from about 0.2 volume percent to about 5 volume percent.

6. The substrate material of claim 1 wherein:
the high surface area particulate filler is fumed silica.

7. The substrate material of claim 1 wherein:
the particulate filler comprises a dielectric material selected from the group consisting of titanium dioxide, barium titanate, strontium titanate, silica, fused amorphous silica, fumed silica, corundum, wollastonite, polytetrafluoroethylene, aramide fibers, fiberglass, $Ba_2Ti_9O_{20}$, glass spheres, quartz, boron nitride, aluminum nitride, silicon carbide, beryllia, alumina and magnesia.

8. The substrate material of claim 1, wherein:
the particulate filler is present in an amount of between about 30 and 50 volume percent of the substrate material.

9. The substrate material of claim 1, wherein:
the woven fabric is present in amount of between about 15 and 25 volume percent of the substrate material.

10. The substrate material of claim 1 wherein:
said conductive material is a metal layer having a preselected coefficient of thermal expansion, wherein the filler and the quantity thereof provide to the electrical substrate material a coefficient of thermal expansion substantially equal to that of the metal layer.

11. The substrate material of claim 1 further including:
a free radical cure initiator, a flame retardant, a cross-linking agent, or a combination thereof.

12. The substrate material of claim 2, wherein
the thermoplastic elastomer is a linear block copolymer or graft-type block copolymer having at least one thermoplastic block.

13. The substrate material of claim 2, wherein
the at least one thermoplastic block is a styrene block or an α-methyl styrene block.

14. The substrate material of claim 1, wherein
the thermosetting composition further comprises a free radical co-curable polymer which is chemically distinct from the polybutadiene or polyisoprene resin and the at least one unsaturated polymer, wherein the co-curable polymer comprises less than 50 volume % of the thermosetting composition, and wherein the co-curable polymer is selected from the group consisting of primarily 1,3-addition butadiene-styrene copolymers, primarily 1,3-addition isoprene-styrene copolymers, primarily 1,3-addition butadiene-α-methyl styrene copolymers, primarily 1,3-addition isoprene-α-methyl styrene copolymers, primarily 1,3-addition butadiene-acrylate copolymers, primarily 1,3-addition isoprene-acrylate copolymers, primarily 1,3-addition butadiene-methacrylate copolymers, primarily 1,3-addition isoprene-methacrylate copolymers, primarily 1,3-addition butadiene-acrylonitrile copolymers, primarily 1,3-addition isoprene-acrylonitrile copolymers, polyethylene, ethylene copolymers, ethylene-propylene copolymers, ethylene-propylene-diene terpolymers, ethylene-ethylene oxide copolymers, natural rubber, norbornene polymers, polydicyclopentadiene; hydrogenated diene polymers, hydrogenated styrene-isoprene-styrene copolymers, and hydrogenated butadiene-acrylonitrile copolymers.

15. The laminate of claim 1, wherein:
said conductive material is a layer of conductive metal.

16. The laminate of claim 1, wherein:
said conductive material is a layer of copper.

17. The laminate of claim 1, further including:
said conductive material being laminated to a least a portion of each of said second opposing surface.

18. The laminate of claim 17, wherein:
said conductive material is copper.

19. The laminate of claim 1, wherein:
said prepreg further includes said woven fabric.

20. The laminate of claim 1, wherein:
said woven fabric is present in an amount from about 10 to about 40 volume percent with respect to the substrate, and said particulate filler is present in an amount of from about 5 to about 60 volume percent with respect to the substrate.

21. The laminate of claim 1, wherein:
said thermosetting composition is present in an amount of from about 25 to about 50 volume percent with respect to the substrate.

22. The laminate of claim 1, wherein:
said polybutadiene or polyisoprene resin has pendant vinyl groups for crosslinking, and said at least one polymer has pendant vinyl groups for cross-linking with the polybutadiene or polyisoprene resin.

23. The laminate of claim 1, wherein:
said at least one unsaturated polymer is a thermoplastic elastomer.

24. The laminate as in claims 14, 20, 21, or 22 wherein:
said unsaturated polymer is a thermoplastic elastomer.

25. The laminate as in 24, wherein:
said at least one unsaturated polymer is a solid thermoplastic elastomer block copolymer.

26. The laminate as in claims 14, 20, 21, or 23, wherein:
said at least one unsaturated polymer is a linear block copolymer or graft-type block copolymer having at least one thermoplastic block.

27. The laminate as in claim 26, wherein:
said at least one thermoplastic block is a styrene block or an α-methyl styrene block.

28. The laminate as in claims 14, 20, 21, 22, or 23, wherein:
said particulate filler is present in an amount by volume which is greater than the amount by volume of the woven fabric.

29. The laminate as in claims 14, 20, 21, 22, or 23, wherein:
said particulate filler is present in an amount by volume which is greater than the amount by volume of the thermosetting composition.

30. The laminate as in claims 14, 20, 21, 22, or 23, wherein:
the particulate filler comprises a high surface area particulate filler in an amount of from about 0.2 volume percent to about 5 volume percent.

31. The laminate as in 30, wherein:
the high surface area particulate filler is fumed silica.

32. The laminate as in claims 14, 20, 21, 22, or 23, wherein:
the particulate filler comprises a dielectric material selected from the group consisting of titanium dioxide, barium titanate, strontium titanate, silica, fused amorphous silica, fumed silica, corundum, wollastonite, polytetrafluoroethylene, aramide fibers, fiberglass, $Ba_2Ti_9O_{20}$, glass spheres, quartz, boron nitride, aluminum nitride, silicon carbide, beryllia, alumina and magnesia.

33. The laminate as in claims 14, 20, 21, 22, or 23, wherein:
the particulate filler is present in an amount of between about 30 and 50 volume percent based on the total substrate.

34. The laminate as in claim 33, wherein:
the woven fabric is present in an amount of between about 15 and 25 volume percent based on the total substrate.

35. The laminate as in claims 14, 20, 21, 22 or 23, wherein:
the woven fabric is present in an amount of between about 15 and 25 volume percent based on the total substrate.

36. The laminate as in claims 14, 20, 21, 22, or 23, wherein:
said thermosetting composition further comprises a free radical cure initiator, a flame retardant, a cross-linking agent, or a combination thereof.

37. The laminate as in claims 14, 20, 21, 22, or 23, wherein:
said conductive material is a layer of metal having a preselected coefficient of thermal expansion, wherein the filler and the quantity thereof provide to the electrical substrate material a coefficient of thermal expansion substantially equal to that of the metal layer.

38. The laminate as in claims 14, 20, 21, 22, or 23, wherein: said conductive material is a layer of conductive metal.

39. The laminate as in claims 14, 20, 21, 22, or 23, wherein:
said conductive material is a layer of copper.

40. The laminate as in claims 14, 20, 21, 22, or 23, further including:
said conductive material being, laminated to a least a portion of each of said two opposing surfaces.

41. The laminate of claim 40, wherein:
said conductive material is copper.

42. The laminate as in claims 14, 20, 21, 22, or 23, wherein:
said prepreg further includes said woven fabric.

* * * * *